(12) United States Patent
Arkun et al.

(10) Patent No.: US 8,664,735 B2
(45) Date of Patent: Mar. 4, 2014

(54) IR SENSOR USING REO UP-CONVERSION

(75) Inventors: Erdem Arkun, San Carlos, CA (US);
Rytis Dargis, Fremont, CA (US);
Andrew Clark, Los Altos, CA (US);
David L. Williams, Menlo Park, CA (US)

(73) Assignee: Translucent, Inc., Palo Alto, CA (US)

( * ) Notice: Subject to any disclaimer, the term of this patent is extended or adjusted under 35 U.S.C. 154(b) by 290 days.

(21) Appl. No.: 13/053,285

(22) Filed: Mar. 22, 2011

(65) Prior Publication Data
US 2012/0241890 A1 Sep. 27, 2012

(51) Int. Cl.
*H01L 31/0232* (2006.01)
*H01L 31/055* (2006.01)

(52) U.S. Cl.
USPC .................. 257/432; 257/43; 257/E21.127

(58) Field of Classification Search
CPC .............. H01L 31/055; H01L 31/0232; H01L 31/02322
USPC ....... 257/80, 432, 43, 431, E31.127, E31.129
See application file for complete search history.

(56) References Cited

U.S. PATENT DOCUMENTS

2010/0038521 A1* 2/2010 Clark et al. ................. 250/208.6
2010/0108134 A1* 5/2010 Ravi .............................. 136/256

* cited by examiner

*Primary Examiner* — Yu Chen
(74) *Attorney, Agent, or Firm* — Parsons & Goltry; Robert A. Parsons; Michael W. Goltry

(57) ABSTRACT

A pumped sensor system includes a substrate with a first layer formed thereon and doped for a first type conduction and a second layer doped for a second type conduction, whereby the first and second layers form a silicon light detector at an up-conversion wavelength. A ternary rare earth oxide is formed on the second layer and crystal lattice matched to the second layer. The oxide is a crystalline bulk oxide with a controlled percentage of an up-conversion component and a majority component. The majority component is insensitive to any of pump, sense, or up-conversion wavelengths and the up-conversion component is selected to produce energy at the up-conversion wavelength in response to receiving energy at the pump and sense wavelengths. The layer of oxide defines a light input area sensitive to a pump wavelength and a light input area sensitive to a sense wavelength.

23 Claims, 4 Drawing Sheets

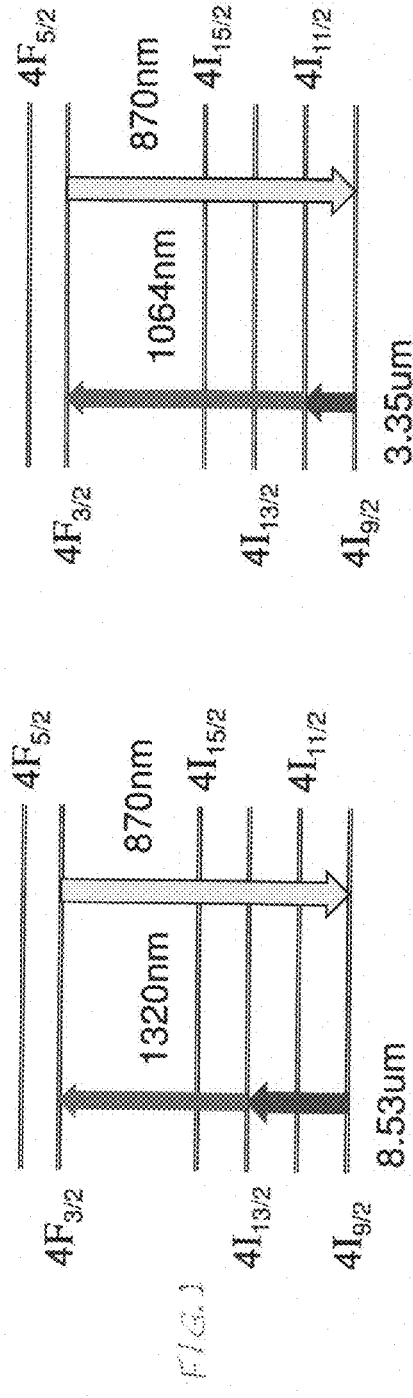

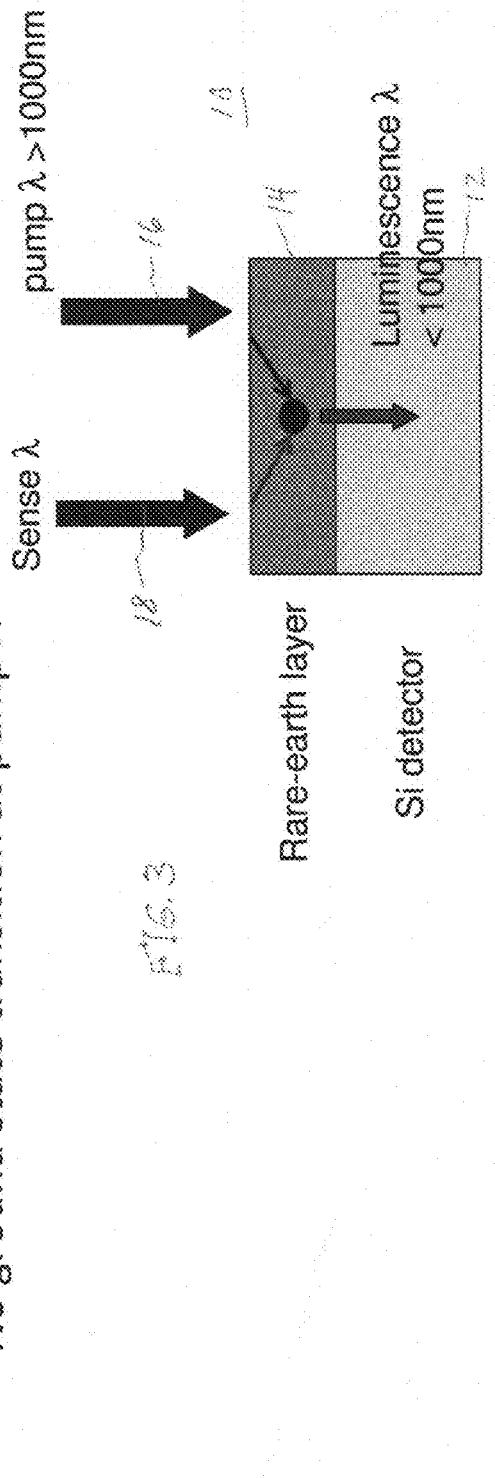

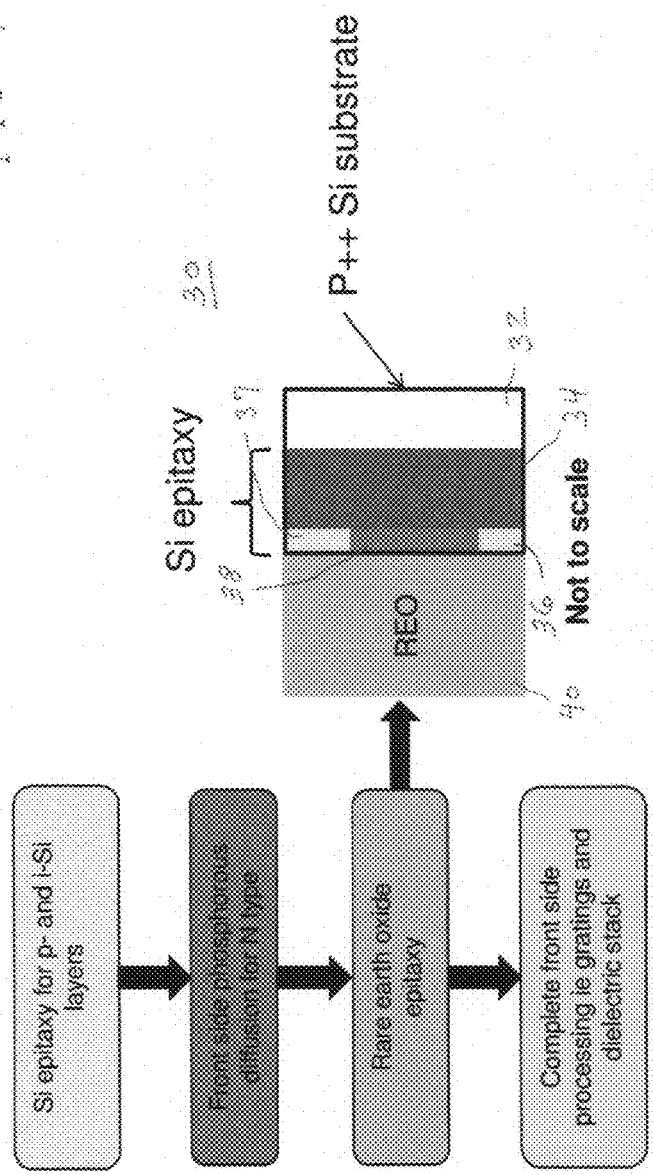

IR SENSOR USING REO UP-CONVERSION

FIELD OF THE INVENTION

This invention relates to infrared radiation sensors and more specifically to IR sensors using rare earth oxides for up-conversion.

BACKGROUND OF THE INVENTION

Infrared radiation sensors (IR sensors) are used in a large variety of industries and apparatus. One major problem is that IR sensors can be extremely costly and difficult to manufacture. A generic explanation of apparatus using rare earth up-conversion materials for IR sensors is provided in a copending United States Patent Application entitled "Monolithically Integrated IR Imaging Using Rare-Earth Up Conversion Materials", Pub. No. US 2010/0038541 A1, Pub. Date. Feb. 18, 2010, and incorporated herein by reference. The present invention provides a more specific device structure with specific rare earth oxides.

An object of the present invention is to provide an IR sensor using rare earth oxides for up-conversion.

Another object of the present invention is to provide an IR sensor using rare earth oxides for up-conversion that can be relatively easily and inexpensively manufactured.

Another object of the present invention is to provide an IR sensor using rare earth oxides for up-conversion that can be adjusted for maximum efficiency at specific IR frequencies.

SUMMARY OF THE INVENTION

Briefly, to achieve the desired objects and aspects of the instant invention in accordance with a preferred embodiment thereof provided is a pumped sensor system including a single crystal silicon substrate with a first single crystal silicon epitaxial layer formed thereon and doped for a first type conduction and a second single crystal silicon epitaxial layer formed on the first layer and doped for a second type conduction, whereby the first and second layers form a silicon detector of light at an up-conversion wavelength. An epitaxial layer of ternary rare earth oxide is formed on the second single crystal silicon epitaxial layer and substantially crystal lattice matched to the second single crystal silicon epitaxial layer. The ternary rare earth oxide is a crystalline bulk oxide with a controlled percentage of an up-conversion component and a majority component. The majority component is chosen to not be sensitive to any of pump, sense, or up-conversion wavelengths and the up-conversion component is selected to produce energy at the up-conversion wavelength in response to receiving energy at the pump and sense wavelengths. The epitaxial layer of ternary rare earth oxide has a first light input area defined thereon sensitive to a pump wavelength of light and a second light input area defined thereon sensitive to a sense wavelength of light.

The desired objects and aspects of the instant invention are further achieved in accordance with a preferred method of fabricating a pumped sensor system including the steps of providing a single crystal silicon substrate, epitaxially growing a first single crystal silicon layer on the substrate, the first layer being doped for a first type conduction and epitaxially growing a second single crystal silicon layer on the substrate, the second layer including a portion doped for a second type conduction, whereby the first and second layers form a silicon detector of light at an up-conversion wavelength. The method further includes the step of epitaxially growing a layer of ternary rare earth oxide on the second single crystal silicon epitaxial layer and substantially crystal lattice matched to the second single crystal silicon epitaxial layer. The ternary rare earth oxide is a crystalline bulk oxide with a controlled percentage of an up-conversion component and a majority component with the majority component being chosen to not be sensitive to any of pump, sense, or up-conversion wavelengths and the up-conversion component being selected to produce energy at the up-conversion wavelength in response to receiving energy at the pump and sense wavelengths. The method further includes the step of defining a first light input area on the epitaxial layer of ternary rare earth oxide sensitive to a pump wavelength of light and defining a second light input area on the epitaxial layer of ternary rare earth oxide sensitive to a sense wavelength of light.

BRIEF DESCRIPTION OF THE DRAWINGS

Specific objects and advantages of the instant invention will become readily apparent to those skilled in the art from the following detailed description of a preferred embodiment thereof taken in conjunction with the drawings, in which:

FIG. 1 is a first energy level diagram for the lanthanide Neodymium (Nd);

FIG. 2 is a second energy level diagram for the lanthanide Neodymium (Nd);

FIG. 3 is a simplified operation diagram of a pumped system;

FIG. 4 is a simplified layer diagram and process flow diagram of a pumped system in accordance with the present invention.

DETAILED DESCRIPTION OF THE DRAWINGS

Figure 5:
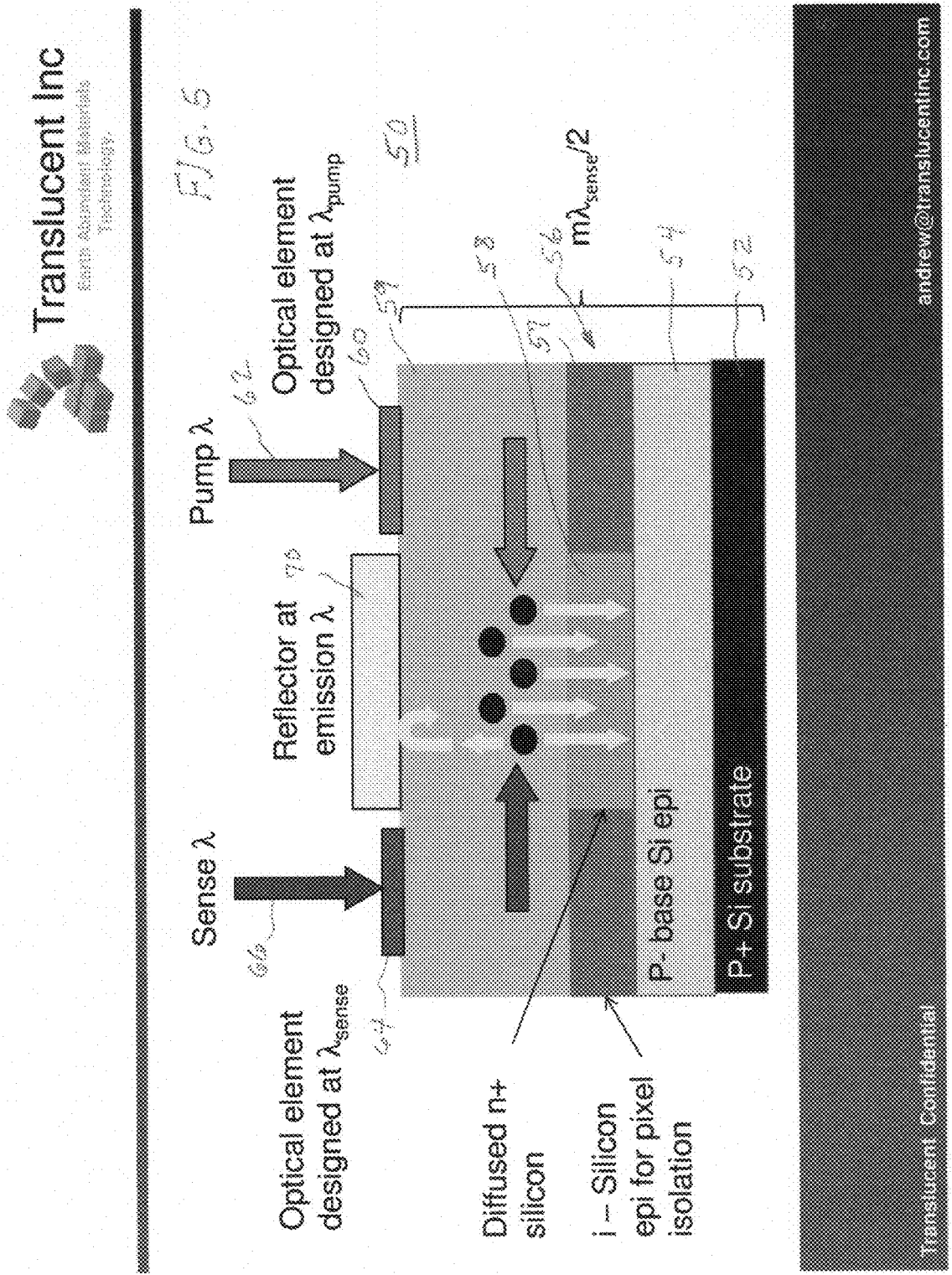
FIG. 5 is a more detailed layer diagram of a pumped system in accordance with the present invention.

The present invention is primarily concerned with specific rare earth up-conversion materials and the incorporation of these materials into IR sensors. Throughout this disclosure the term "sense wavelength" refers to the wavelength of the infrared radiation being sensed or detected and the term "pump wavelength" refers to the wavelength of the pump energy being supplied to the IR sensor. While a variety of different rare earth materials can be used for the up-conversion process there are a variety of process steps that can be conveniently dealt with through the material selection to maximize efficiency and manufacturing ease.

As a specific example of a preferred material incorporated into the present invention the ternary RE oxide, $(Gd_{1-x}Nd_x)_2O_3$ is discussed herein with the understanding that other materials with similar or equivalent characteristics might be used. One of the distinguishing characteristics of the preferred ternary RE oxide is that Gd has no optical transitions at either the sense wavelength or the pump wavelength. A second distinguishing characteristic of the preferred ternary RE oxide is that the bulk material is designed to be single crystal material on silicon, which favors the use of $Gd_2O_3$, since $Gd_2O_3$ is substantially lattice matched to silicon. Thus, a layer of bulk single crystal $Gd_2O_3$ can be epitaxially grown on single crystal silicon in a substantially continuous process.

A further distinguishing characteristic of the preferred ternary RE oxide is that the Nd has the $1^{st}$ two 4f energy levels in the IR spectrum. Referring to FIG. 1 a first example of IR radiation that matches the energy levels in Nd is illustrated. In this example it can be seen that infrared radiation with a wavelength of 8.53 μm produces an energy transition from the $4I_{9/2}$ level to the $4I_{13/2}$ level. Pumped energy with a wavelength of 1320 nm then produces a second energy transition to the $4f_{3/2}$ energy level, which produces an optical transition or radiation at a wavelength of 870 nm. Referring additionally to FIG. 2 a second example of IR radiation that matches the energy levels in Nd is illustrated. In this example it can be seen that infrared radiation with a wavelength of 3.35 μm produces an energy transition from the $4I_{9/2}$ level to the $4I_{11/2}$ level. Pumped energy with a wavelength of 1065 nm then produces a second energy transition to the $4f_{3/2}$ energy level, which produces an optical transition or radiation at a wavelength of 870 nm. Also, no transition from the ground state ($4I_{9/2}$ level) to a higher level is produced in Nd at the pump wavelength.

In most rare earth materials used for optical detection, the material producing the emission needs to be in a 2% to 10% concentration range to perform efficiently. Thus, a further distinguishing characteristic of the preferred ternary RE oxide, $(Gd_{1-x}Nd_x)_2O_3$, is that the ratio of Gd:Nd can be easily controlled to optimize optical performance.

Turning now to FIG. 3, a simplified operation diagram of a pumped system 10 is illustrated. Pumped system 10 includes a silicon detector 12 overlaid with a layer 14 of rare earth oxide. Layer 14 is specifically designed or selected to receive pump energy (represented by an arrow 16) at a wavelength above 1000 nm and a sense radiation (represented by an arrow 18) at some lower frequency, in this specific application, a wavelength in the infrared band. It is important that the pump wavelength be selected so that no ground state transitions occur as a result of the pump energy, i.e. layer 14 does not produce optical transition or luminescence in response to the pump energy. The pump energy and sense radiation cooperate in layer 14 to produce up-conversion or energy transitions resulting in an optical transition or luminescence at wavelengths below approximately 1000 nm. The optical transition is selected to be detected by silicon detector 12. Thus, pumped system 10 is a relatively sensitive infrared detector and the desired infrared detection occurs using a relatively inexpensive silicon detector.

Referring to FIG. 4, a simplified layer diagram and process flow diagram of a pumped system 30 in accordance with the present invention are illustrated. In the fabrication process of pumped system 30, a p++ doped single crystal silicon substrate 32 is provided. Substrate 32 can be a silicon wafer or any part of a wafer depending upon the process and apparatus used. A first layer 34 of single crystal silicon with p doping is epitaxially grown on the surface of substrate 32. An intrinsic or undoped layer 36 of single crystal silicon is epitaxially grown on layer 34. An n-type diffusion is performed in a central portion of intrinsic layer 36 by, for example, performing a front side phosphorous diffusion to produce an n doped area 38 in layer 36 surrounded by intrinsic silicon 37. N doped area 38 is in contact with p doped layer 34 to form a p-n light detector.

In many applications pumped system 30 will be fabricated as a single pixel in an array of pixels formed on a wafer or other relatively large piece of silicon. In such applications it will be most expedient to perform the n doping step of layer 36 using a lithographic mask (not shown). By masking intrinsic layer 36 for the n doping process, the boundaries are fairly well defined and intrinsic area 37 of layer 36 surrounding n doped area 38 provides pixel to pixel isolation.

With the silicon detector completed a layer 40 of single crystal rare earth oxide is epitaxially grown on the front surface of layer 36. By selecting a rare earth oxide that is substantially lattice matched with the silicon the rare earth oxide can be grown directly on the silicon as a single crystal material with a minimum or no fractures, stress, etc. The front side processing is then completed by forming any light enhancing features on the front surface of layer 40. Thus, the entire pumped system or any desired arrays of the pumped system are relatively easily fabricated using standard silicon procedures and a relatively simple silicon light detector.

Referring now to FIG. 5, a specific embodiment of a pumped system 50 in accordance with the present invention is illustrated. Pumped system 50 includes a heavily p doped single crystal silicon substrate 52, which may be a single chip or a component in an array of chips defined in a silicon wafer. A p doped layer 54 of single crystal silicon is epitaxially grown on substrate 52. An intrinsic layer 56 of single crystal silicon is epitaxially grown on layer 54. A central portion 58 of layer 56 is doped with n+ type material to form a p-n junction that performs the light sensing function. A remaining intrinsic portion 57 of layer 56 surrounding central portion 58 serves to isolate pumped system 50 from adjacent pumped systems or pixels. A single crystal layer 59 of rare earth oxide is epitaxially grown on the surface of layer 56.

An optical element 60 is formed on the upper (front) surface of layer 59 and specifically designed to scatter received energy or light (represented by an arrow 62) at the pump wavelength in the plane of layer 59. An optical element 64 is formed on the upper (front) surface of layer 59 and specifically designed to scatter received energy or light (represented by an arrow 66) at the sense wavelength in the plane of layer 59. Elements 60 and 64 are separated or positioned on opposite sides of layer 59 to provide a generally centrally located area in the middle. Elements 60 and 64 may be any type of optical device designed to perform the scattering function, such as a diffraction grating or the like.

A reflector 70 is positioned on the upper or front surface of layer 59 between elements 60 and 64. As can be seen in FIG. 5, reflector 70 is positioned substantially above and in alignment with central portion 58 so that light reflected by reflector 70 is directed downwardly directly into the silicon detector. In addition, reflector 70 is specifically designed to reflect light at the emission wavelength of the rare earth oxide. Thus, any light emitted upwardly by layer 59 is reflected and directed downwardly to the silicon detector. Reflector 70 may be for example a dielectric reflector such as a DBR (distributed Bragg reflector) or the like, which are well known and described in detail in the semiconductor laser art and which are highly tunable to reflect any specific wavelength of light. In a slightly different embodiment the overall thickness of pumped system 50 can be designed as a light cavity to enhance light interaction within the structure. For example, the overall thickness could be a half wavelength, or a multiple thereof, of the emission wavelength of the rare earth oxide.

In the preferred embodiment layer 59 includes the ternary RE oxide, $(Gd_{1-x}Nd_x)_2O_3$. One distinguishing characteristics of the preferred ternary RE oxide is that Gd has no optical transitions at either the sense wavelength or the pump wavelength. Also, no transition from the ground state to a higher level is produced in Nd at the pump wavelength. The preferred ternary RE oxide is a crystalline bulk oxide with a controlled percentage of the up-conversion material (Nd) and a majority component (Gd) chosen to not be sensitive to any of the pump, sense, or up-conversion wavelengths. Further, the preferred ternary RE oxide is designed to be single crystal material epitaxially grown on silicon, since $Gd_2O_3$ is substantially lattice matched to silicon in pumped system 50. Further, in the preferred ternary RE oxide the Nd has the $1^{st}$ two 4f energy levels in the IR spectrum. By scattering the pump light and the sense or IR light throughout the RE oxide layer, maximum luminescence is achieved. Also by reflecting the luminescence into the silicon detector maximum detection is achieved. Thus, a pumped system is disclosed that is a relatively sensitive infrared detector and the desired infrared detection occurs using a relatively inexpensive silicon detector.

Various changes and modifications to the embodiments herein chosen for purposes of illustration will readily occur to those skilled in the art. To the extent that such modifications and variations do not depart from the spirit of the invention, they are intended to be included within the scope thereof, which is assessed only by a fair interpretation of the following claims.

Having fully described the invention in such clear and concise terms as to enable those skilled in the art to understand and practice the same, the invention claimed is:

1. A pumped sensor system comprising:
    a single crystal silicon substrate;
    a first single crystal silicon epitaxial layer formed on the substrate, the first layer being p-doped for a first type conduction;
    a second single crystal silicon epitaxial layer of intrinsic silicon formed on the substrate, the second layer including a central portion n-doped for a second type conduction, whereby the first and second layers form a P/N junction silicon detector of light at an up-conversion wavelength;
    an epitaxial layer of ternary rare earth oxide formed on the second single crystal silicon epitaxial layer and substantially crystal lattice matched to the second single crystal silicon epitaxial layer, the ternary rare earth oxide being a crystalline bulk oxide with a controlled percentage of an up-conversion component and a majority component, the majority component being chosen to not be sensitive to any of pump, sense, or up-conversion wavelengths, the up-conversion component being selected to produce energy at the up-conversion wavelength in response to receiving energy at the pump and sense wavelengths; and
    the epitaxial layer of ternary rare earth oxide having a first light input area defined thereon sensitive to a pump wavelength of light and a second light input area defined thereon sensitive to a sense wavelength of light.

2. A pumped sensor system as claimed in claim 1 further including a first optical element positioned on the first light input area of the layer of ternary rare earth oxide and designed to scatter light at the pump wavelength through the layer of ternary rare earth oxide.

3. A pumped sensor system as claimed in claim 2 wherein the first optical element includes a diffraction grating.

4. A pumped sensor system as claimed in claim 1 further including a second optical element positioned on the second light input area of the layer of ternary rare earth oxide and designed to scatter light at the sense wavelength through the layer of ternary rare earth oxide.

5. A pumped sensor system as claimed in claim 4 wherein the second optical element includes a diffraction grating.

6. A pumped sensor system as claimed in claim 1 further including a reflector positioned on the layer of ternary rare earth oxide and designed to reflect light at the up-conversion wavelength into the silicon detector of light.

7. A pumped sensor system as claimed in claim 6 wherein the reflector is a distributed Bragg reflector.

8. A pumped sensor system as claimed in claim 1 wherein the substrate, the first single crystal silicon epitaxial layer, the second single crystal silicon epitaxial layer, and the layer of ternary rare earth oxide have a combined thickness approximately equal to one half wavelength or multiple thereof at the up-conversion wavelength.

9. A pumped sensor system as claimed in claim 1 wherein the sense wavelength of light is in the infrared spectrum.

10. A pumped sensor system as claimed in claim 1 wherein the layer of ternary rare earth oxide includes $(Gd_{1-x}Nd_x)_2O_3$.

11. A pumped sensor system as claimed in claim 1 wherein the portion doped for a first type conduction is p doped and the portion doped for a second type conduction is n doped.

12. A pumped sensor system comprising:
    a single crystal silicon substrate;
    a first single crystal silicon epitaxial layer formed on the substrate, the first layer being doped for p type conduction;
    a second single crystal silicon epitaxial layer of intrinsic silicon formed on the substrate, the second layer including a central portion doped for n type conduction, whereby the first and second layers form a silicon p/n junction detector of light at an up-conversion wavelength;
    an epitaxial layer of ternary rare earth oxide formed on the second single crystal silicon epitaxial layer and substantially crystal lattice matched to the second single crystal silicon epitaxial layer, the ternary rare earth oxide being a crystalline bulk oxide with a controlled percentage of an up-conversion component and a majority component, the majority component being chosen to not be sensitive to any of pump, sense, or up-conversion wavelengths, the up-conversion component being selected to produce energy at the up-conversion wavelength in response to receiving energy at the pump and sense wavelengths; and
    a first optical element positioned on the layer of ternary rare earth oxide and designed to scatter light at the pump wavelength through the layer of ternary rare earth oxide;
    a second optical element positioned on the layer of ternary rare earth oxide and designed to scatter light at the sense wavelength through the layer of ternary rare earth oxide; and
    a reflector positioned on the layer of ternary rare earth oxide and designed to reflect light at the up-conversion wavelength into the silicon detector.

13. A pumped sensor system as claimed in claim 12 wherein the first optical element includes a diffraction grating.

14. A pumped sensor system as claimed in claim 12 wherein the second optical element includes a diffraction grating.

15. A pumped sensor system as claimed in claim 12 wherein the sense wavelength of light is in the infrared spectrum.

16. A pumped sensor system as claimed in claim 12 wherein the layer of ternary rare earth oxide includes $(Gd_{1-x}Nd_x)_2O_3$.

17. A pumped sensor system as claimed in claim 12 wherein the reflector is a distributed Bragg reflector.

18. A pumped sensor system as claimed in claim 12 wherein the substrate, the first single crystal silicon epitaxial layer, the second single crystal silicon epitaxial layer, and the layer of ternary rare earth oxide have a combined thickness approximately equal to one half wavelength or multiple thereof at the up-conversion wavelength.

19. A pumped infra red sensor system designed to receive energy at a pumped wavelength and energy at an infrared wavelength, the sensor system comprising:
    a single crystal silicon substrate;
    a first single crystal silicon epitaxial layer formed on the substrate, the first layer being doped for a first type conduction;

a second single crystal intrinsic silicon epitaxial layer formed on the substrate, the second layer including a central portion doped for a second type conduction, the first doped layer and the doped portion of the second layer forming a silicon junction light detector;

an epitaxial layer of ternary rare earth oxide formed on the second single crystal silicon epitaxial layer and substantially crystal lattice matched to the second single crystal silicon epitaxial layer, the ternary rare earth oxide being a crystalline bulk oxide with a controlled percentage of an up-conversion component and a majority component, the majority component being chosen to have no optical transitions at either the infrared wavelength, the pump wavelength, or an up-conversion wavelength, the up-conversion component being selected to produce energy at the up-conversion wavelength only in response to receiving energy at both the pump wavelength and the infrared wavelength;

a first light input element positioned on the epitaxial layer of ternary rare earth oxide and sensitive to the pump wavelength of light; and a second light input element positioned on the epitaxial layer of ternary rare earth oxide separate from the first light input area and sensitive to the infrared wavelength of light.

20. A pumped infra red sensor system as claimed in claim 19 further including a reflector positioned on the layer of ternary rare earth oxide between the first light input element and the second light input element and designed to reflect light at the up-conversion wavelength into the silicon junction light detector.

21. A pumped infra red sensor system as claimed in claim 19 wherein the first layer is doped for p-type conduction and the central portion of the second layer is doped for n-type conduction, the first doped layer and the doped portion of the second layer forming a silicon p/n junction light detector.

22. A pumped infra red sensor system as claimed in claim 19 wherein the layer of ternary rare earth oxide includes $(Gd_{1-x}Nd_x)_2O_3$.

23. A pumped sensor system as claimed in claim 19 wherein the first optical element includes a diffraction grating tuned to the pump wavelength and the second optical element includes a diffraction grating tuned to the infrared wavelength.

* * * * *